(12) United States Patent
Chiu et al.

(10) Patent No.: US 12,328,892 B2
(45) Date of Patent: Jun. 10, 2025

(54) TWO-DIMENSIONAL SEMICONDUCTOR AND MANUFACTURING METHOD THEREOF

(71) Applicant: NATIONAL TSING HUA UNIVERSITY, Hsinchu (TW)

(72) Inventors: Po-Wen Chiu, Hsinchu (TW); Chao-Hui Yeh, Yunlin County (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 256 days.

(21) Appl. No.: 18/048,861

(22) Filed: Oct. 24, 2022

(65) Prior Publication Data

US 2023/0369478 A1 Nov. 16, 2023

(30) Foreign Application Priority Data

May 13, 2022 (TW) ................................. 111118037

(51) Int. Cl.
*H10D 30/47* (2025.01)
*H10D 30/01* (2025.01)

(52) U.S. Cl.
CPC ......... *H10D 30/473* (2025.01); *H10D 30/015* (2025.01)

(58) Field of Classification Search
CPC .... H10D 30/473; H10D 30/015; H10D 30/47; H10D 99/00; H10D 62/80; H10D 62/151
See application file for complete search history.

(56) References Cited

U.S. PATENT DOCUMENTS

| | | |
|---|---|---|
| 2018/0337252 A1 | 11/2018 | Nemouchi et al. |
| 2019/0148493 A1* | 5/2019 | Lee .................. H01L 21/02527 257/27 |
| 2019/0371925 A1 | 12/2019 | Liu et al. |

FOREIGN PATENT DOCUMENTS

TW 201824375 A 7/2018

* cited by examiner

*Primary Examiner* — Mohammad A Rahman
(74) *Attorney, Agent, or Firm* — CKC & Partners Co., LLC

(57) ABSTRACT

A two-dimensional semiconductor is configured for contacting two metals and includes a first semiconductor layer and a plurality of second semiconductor layers. The first semiconductor layer includes a channel region and two metal contacting regions. The two metal contacting regions are connected to two sides of the channel region, respectively. A plurality of heterojunctions having type-II band alignment are formed by the second semiconductor layers and the two metal contacting regions of the first semiconductor layer, respectively, and the heterojunctions are arranged and spaced away from each other.

11 Claims, 8 Drawing Sheets

TWO-DIMENSIONAL SEMICONDUCTOR AND MANUFACTURING METHOD THEREOF

RELATED APPLICATIONS

This application claims priority to Taiwan Application Serial Number 111118037, filed May 13, 2022, which is herein incorporated by reference.

BACKGROUND

Technical Field

The present disclosure relates to a semiconductor and a manufacturing method thereof. More particularly, the present disclosure relates to a two-dimensional semiconductor configured for contacting metals and a manufacturing method thereof.

Description of Related Art

With the advance of technology, 3C products are applied widely in our lives. To satisfy people's needs, those in the industry have applied various semiconductor materials on different electronic elements or optoelectronic devices in 3C products. With the desire for miniaturization of various 3C products such as cell phones and tablets, those in the industry have started to use a two-dimensional semiconductor with a thickness equaling a few atoms as a channel semiconductor material of the electronic element or the optoelectronic device. However, the contact resistance of the surface where the two-dimensional semiconductor contacts the metal electrode can be increased due to Schottky barrier. Consequently, the energy dissipation increases, and the lifetime of the electronic element or the optoelectronic device can be even decreased. Thus, those in the industry have developed a method of inserting a layer or graphene between the metal electrode and the two-dimensional semiconductor to decrease the contact resistance, but this method is not compatible with recent silicon manufacturing processes for conventional semiconductor elements. As a result, the contact resistance cannot be decreased effectively, and the difficulty of the manufacturing process increases.

Therefore, a two-dimensional semiconductor and a manufacturing method thereof which can be compatible with recent silicon manufacturing processes and decrease the contact resistance effectively are still a goal that those in the industry pursue.

SUMMARY

According to one aspect of the present disclosure, a two-dimensional semiconductor is configured for contacting two metals and includes a first semiconductor layer and a plurality of second semiconductor layers. The first semiconductor layer includes a channel region and two metal contacting regions. The two metal contacting regions are connected to two sides of the channel region, respectively. A plurality of heterojunctions having type-II band alignment are formed by the second semiconductor layers and the two metal contacting regions of the first semiconductor layer, respectively, and the heterojunctions are arranged and spaced away from each other.

According to another aspect of the present disclosure, a manufacturing method for a two-dimensional semiconductor which contacts two metals includes a first semiconductor layer providing step and a second semiconductor layer disposing step. The first semiconductor layer providing step is performed to provide a first semiconductor layer which includes two metal contacting regions. The second semiconductor layer disposing step is performed to provide a plurality of second semiconductor layers, arrange a part of the second semiconductor layers on one of the two metal contacting regions of the first semiconductor layer in intervals to form a plurality of first heterojunctions with type-II band alignment, and arrange another part of the second semiconductor layers on the other one of the two metal contacting regions of the first semiconductor layer in intervals to form a plurality of second heterojunctions with type-II band alignment, wherein an exposed top surface of each of the two metal contacting regions and a top surface of each of the second semiconductor layers are configured for contacting one of the two metals.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
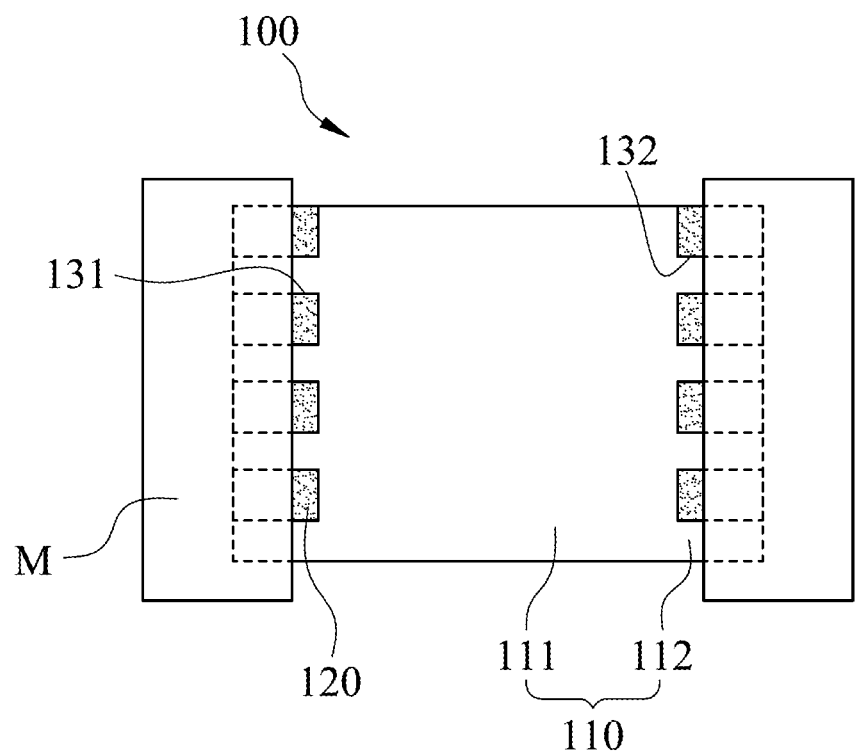
FIG. 1 shows a schematic view of a two-dimensional semiconductor contacting two metals according to the 1st embodiment of the present disclosure.

The embodiments will be described with the drawings. For clarity, some practical details will be described below. However, it should be noted that the present disclosure should not be limited by the practical details, that is, in some embodiments, the practical details are unnecessary. In addition, for simplifying the drawings, some conventional structures and elements will be simply illustrated, and repeated elements may be represented by the same reference numerals.

It will be understood that when an element (or device) is referred to as being "connected to" another element, it can be directly connected to the other element, or it can be indirectly connected to the other element, that is, intervening elements may be present. In contrast, when an element is referred to as being "directly connected to" another element, there are no intervening elements present. In addition, the terms first, second, third, etc. are used herein to describe various elements or components, and these elements or components should not be limited by these terms. Consequently, a first element or component discussed below could be termed a second element or component. Moreover, a combination of these elements (unite or circuits) of the present closure is not a common combination in this art, so it cannot be predicted whether a relation of the combination hereof can be easily done by a person having skill in the art by these elements.

Figure 2:
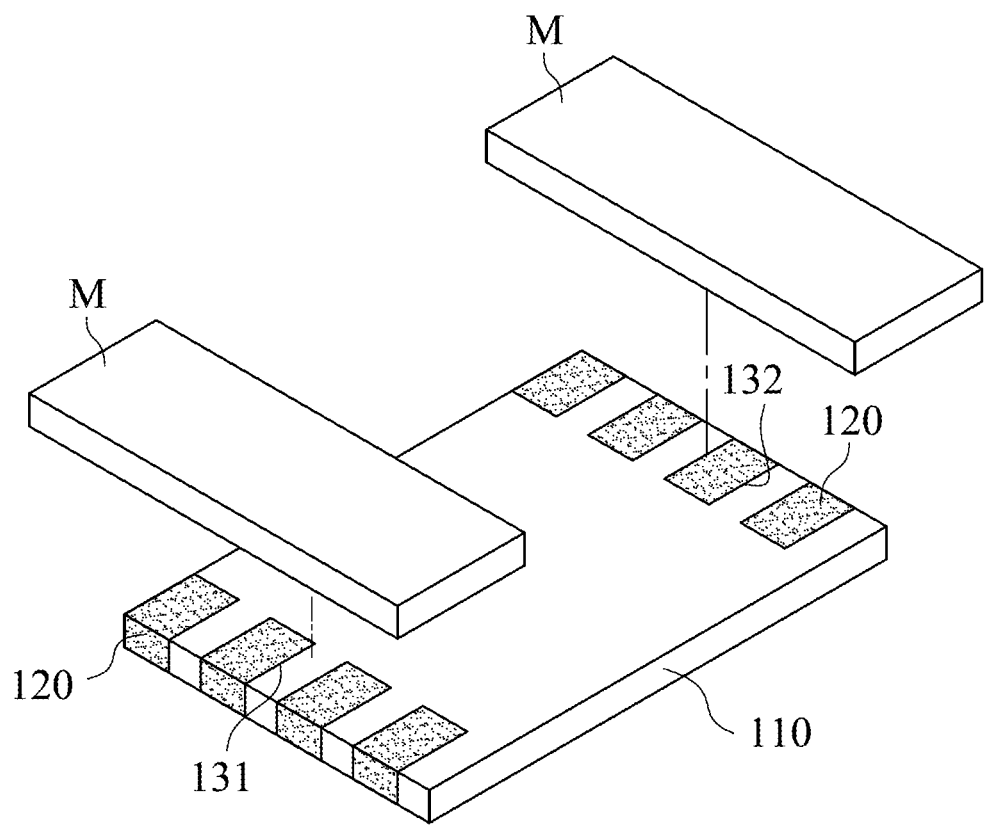
FIG. 2 shows a three-dimensional exploded view of the two-dimensional semiconductor and the metals according to the 1st embodiment in FIG. 1.

FIG. 1 shows a schematic view of a two-dimensional semiconductor 100 contacting two metals M according to the 1st embodiment of the present disclosure. FIG. 2 shows a three-dimensional exploded view of the two-dimensional semiconductor 100 and the metals M according to the 1st embodiment in FIG. 1. As shown in FIGS. 1 and 2, the two-dimensional semiconductor 100 is configured for contacting the two metals M and includes a first semiconductor layer 110 and a plurality of second semiconductor layers 120. The first semiconductor layer 110 includes a channel region 111 and two metal contacting regions 112. The two metal contacting regions 112 are connected to two sides of the channel region 111, respectively. A plurality of heterojunctions having type-II band alignment are formed by the second semiconductor layers 120 and the two metal contacting regions 112 of the first semiconductor layer 110, respectively, wherein the heterojunctions are arranged and spaced away from each other. Specifically, a part of the second semiconductor layers 120 is arranged on one of the two metal contacting regions 112 of the first semiconductor layer 110 in intervals to form a plurality of first heterojunctions 131 with type-II band alignment, and another part of the second semiconductor layers 120 is arranged on the other one of the two metal contacting regions 112 of the first semiconductor layer 110 in intervals to form a plurality of second heterojunctions 132 with type-II band alignment; that is, the heterojunctions can be separated into the first heterojunctions 131 and the second heterojunctions 132 according to positions thereof, but such a configuration is only for illustration, and the present disclosure is not limited thereto. An exposed top surface of each of the two metal contacting regions 112 and a top surface of each of the second semiconductor layers 120 are configured for contacting one of the two metals M. In the other words, a part of a top surface of each of the two metal contacting regions 112 is replaced by the second semiconductor layers 120, and the other part of the top surface of each of the two metal contacting regions 112 which is not replaced thereby is exposed, that is, the first semiconductor layer 110 and each of the second semiconductor layers 120 are arranged alternately so that each of the two metals M contacts the first semiconductor layer 110 and the second semiconductor layers 120 in alternate arrangement.

Therefore, through the binding of the first semiconductor layer 110 with each of the second semiconductor layers 120 in type-II band alignment, the whole of the two-dimensional semiconductor 100 forms a hetero structure. Furthermore, in type-II band alignment, electrons can flow between conduction bands of each of the two metal contacting regions 112 and each of the second semiconductor layers 120, and electron holes can flow between valence bands of each of the two metal contacting regions 112 and each of the second semiconductor layers 120, so that a periodic semiconductor hetero structure of $p^+$-$n^+$ type alternate arrangement is formed by alternately arranging each of the two metal contacting regions 112 of the first semiconductor layer 110 and each of the second semiconductor layers 120 to form a metallized semiconductor structure with low electric resistance. Moreover, when the two-dimensional semiconductor 100 contacts each of the two metals M which is used as a contact electrode, the Schottky barrier is extremely low, and the contact resistance can be decreased greatly. For example, the contact resistance of the conventional two-dimensional semiconductor is at least larger than 10 k$\Omega\cdot\mu$m, while the contact resistance of the two-dimensional semiconductor of the present disclosure can be less than 1 k$\Omega\cdot\mu$m; therefore, compared with the conventional two-dimensional semiconductor, the contact resistance of the two-dimensional semiconductor of the present disclosure can be decreased greatly. Hence, for a semiconductor element to which the two-dimensional semiconductor of the present disclosure is applied, the requirement of processing miniaturized electronic elements can be satisfied, and the energy dissipation caused by the contact resistance can be also reduced at the same time. Details of the two-dimensional semiconductor 100 will be described below.

The first semiconductor layer 110 can be made of an n-type compound layered semiconductor such as $Bi_2O_2Se$ and InSe or a transition metal dichalcogenides layered semiconductor such as $WS_2$ or $MoS_2$, and each of the second semiconductor layers 120 can be made of a p-type compound layered semiconductor or a transition metal dichalcogenides layered semiconductor such as $WSe_2$. In the 1st embodiment, the first semiconductor layer 110 can be made of $WS_2$, each of the second semiconductor layers 120 can be made of $WSe_2$, the first semiconductor layer 110 made of $WS_2$ can be used as an n-type semiconductor, and each of the second semiconductor layers 120 made of $WSe_2$ can be used as a p-type semiconductor. In other embodiments, the first semiconductor layer can also be used as a p-type semiconductor, each of the second semiconductor layers can also be used as an n-type semiconductor, and the present disclosure is not limited thereto.

Specifically, the potential energy of the conduction band of the first semiconductor layer 110 is lower than the potential energy of the conduction band of each of the second semiconductor layers 120, the potential energy of the valence band of the first semiconductor layer 110 is lower than the potential energy of the valence band of each of the second semiconductor layers 120, and the potential energy of the valence band of each of the second semiconductor layers 120 is ranged between the potential energy of the conduction band and the valence band of the first semiconductor layer 110. Therefore, band offsets with type-II band alignment at the first heterojunctions 131 and the second heterojunctions 132 formed by the first semiconductor layer 110 contacting each of the second semiconductor layers 120 are formed. Furthermore, charge carriers of the first semiconductor layer 110 which contacts bottoms of the two metals M and charge carriers of the second semiconductor layers 120 can cross the heterojunctions, and then each of the first semiconductor layer 110 and the second semiconductor layers 120 is doped. Hence, the electrons near the first heterojunctions 131 and the second heterojunctions 132 can flow from each of the second semiconductor layers 120 with high potential energy of the conduction band to the first semiconductor layer 110 with low potential energy of the conduction band, and the electron holes flow from the first semiconductor layer 110 with low potential energy of the valence band to each of the second semiconductor layers 120 with high potential energy of the valence band, then the first semiconductor layer 110 and the second semiconductor layers 120 have more electrons and electron holes, respectively, and the heavily-doped like $n^+$-type semiconductor is formed on each of the two metal contacting regions 112 near the first heterojunctions 131 and the second heterojunctions 132; in contrast, the heavily-doped like $p^+$-type semiconductor is formed on each of the second semiconductor layers 120 near the first heterojunctions 131 and the second heterojunctions 132. In detail, a charge carrier concentration of each of the first semiconductor layer 110 which contacts bottoms of the two metals M and the second semiconductor layers 120 increases to metallize the first semiconductor layer 110 and the second semiconductor layers 120. Hence, by good conductivity of metal-like heavily doped semiconductor, the first semiconductor layer 110 and the second semiconductor layers 120 are metallized to greatly decrease Schottky barrier when the two metal contacting regions 112 contact the two metals M. Moreover, the channel region 111 is an n-type channel, and Schottky barrier of the n-type channel can be decreased significantly because a part of an interface between the two metals M and the first semiconductor layer 110 is $n^+$-type heavily doped.

Moreover, in the conventional technology of a two-dimensional semiconductor, to decrease Schottky barrier, the work function of a material of the two-dimensional semiconductor must be taken in consideration. However, in the present disclosure, by the periodic semiconductor hetero structure formed by alternately arranging each of the two metal contacting regions 112 of the first semiconductor layer 110 and each of the second semiconductor layers 120, work functions of the first semiconductor layer 110 used as a channel semiconductor need not be taken in consideration, so the periodic semiconductor hetero structure can fit for different semiconductor materials with different work functions.

Figure 3:
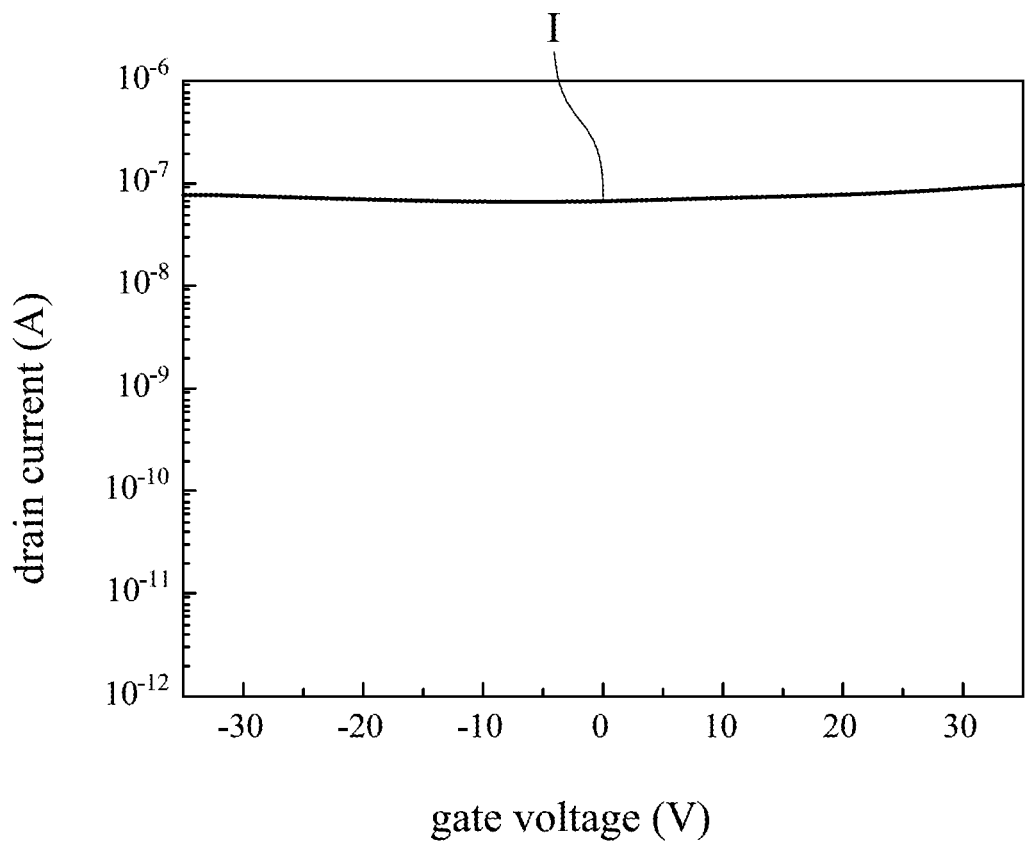
FIG. 3 shows a diagram of a drain current and a gate voltage of a semiconductor element to which the two-dimensional semiconductor is applied according to the 1st embodiment in FIG. 1.

Reference is made to FIGS. 1 and 3. FIG. 3 shows a diagram of a drain current I and a gate voltage of a semiconductor element to which the two-dimensional semiconductor 100 is applied according to the 1st embodiment in FIG. 1. In particular, each of the two metals M can be a transition metal, a semi-metal or a noble metal, but the present disclosure is not limited thereto. When the two-dimensional semiconductor 100 is applied to the semiconductor element, each of the two metals M can be a source electrode and a drain electrode which cover a surface of the periodic semiconductor hetero structure formed by alternately arranging each of the two metal contacting regions 112 of the first semiconductor layer 110 and each of the second semiconductor layers 120, and the two-dimensional semiconductor 100 is used as an n-type semiconductor channel. Through the configuration of low Schottky barrier, when adjusting the gate voltage to drive the drain current I to flow from the metal M used as the drain electrode to the metal contacting region 112, a field effect on a region of the periodic semiconductor hetero structure formed by alternately arranging each of the two metal contacting regions 112 of the first semiconductor layer 110 and each of the second semiconductor layers 120 vanishes, such that consumption caused by contact resistance when the conventional two-dimensional conductor contacts the metal can be avoided.

As shown in FIG. 1, in the 1st embodiment, the first semiconductor layer 110 and each of the second semiconductor layers 120 are rectangle-shaped structure layers, but in other embodiments, the shapes of the first semiconductor layer and each of the second semiconductor layers of the present disclosure can be other shapes, and the present disclosure is not limited thereto. Furthermore, all of the first semiconductor layer 110 and the second semiconductor layers 120 can be composed of a single-layered semiconductor, but in other embodiments, all of the first semiconductor layer and the second semiconductor layers can be composed of a plurality of single-layered semiconductors stacked on top of each other, and the present disclosure is not limited thereto. Moreover, each of the first heterojunctions 131 can be arranged and spaced evenly from each other, and each of the second heterojunctions 132 can be arranged and spaced evenly from each other. Specifically, a width of the exposed top surface of each of the two metal contacting regions 112 equals to a width of the top surface of each of the second semiconductor layers 120, but the present disclosure is not limited thereto. Furthermore, the width of the exposed top surface of each of the two metal contacting regions 112 and the top surface of each of the second semiconductor layers 120 can be in a range from 10 nm-10000 nm. In other embodiments, a spaced distance between each of the heterojunctions can be different from each other. In other words, it is not necessary for each of the heterojunctions to be arranged and spaced evenly from each other, and a spaced distance between each of the heterojunctions does not have to be equivalent.

As shown in FIG. 2, the two metal contacting regions 112 of the first semiconductor layer 110 which contact bottoms of the two metals M can be bonded to the second semiconductor layers 120 in a seamless structure to form the two hetero structures, respectively. That is, a surface where the two metal contacting regions 112 contact the second semiconductor layers 120 is seamless and forms the first heterojunctions 131 and the second heterojunctions 132, and each of the first heterojunctions 131 and the second heterojunctions 132 forms the periodic semiconductor hetero structure formed by alternate arrangement.

In other embodiments, each of the two metal contacting regions can be a comb structure and has a plurality of gaps, the gaps are arranged and spaced away from each other, and each of the second semiconductor layers is disposed in each of the gaps. Hence, an area where each of the two metal contacting regions contacts each of the second semiconductor layers can be increased to further increase the heterojunctions with type-II band alignment.

Moreover, in other embodiments, the second semiconductor layers can be stacked on the two metal contacting regions of the first semiconductor layer which contact bottoms of the two metals to form two hetero structures, respectively. Specifically, the second semiconductor layers can be disposed on the two metal contacting regions, and each of the second semiconductor layers contacts each of the two metal contacting regions to form the hetero structures. Hence, the manufacturing process of the two-dimensional semiconductor can be simplified.

Figure 4:
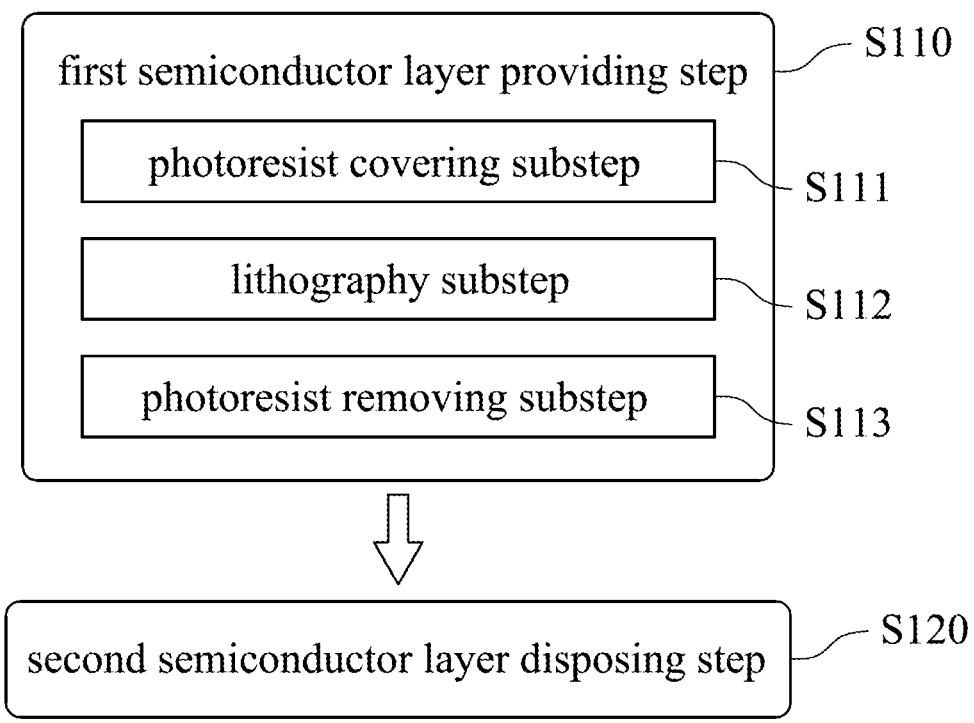
FIG. 4 shows a flow diagram of a manufacturing method for a two-dimensional semiconductor according to the 2nd embodiment of the present disclosure.

FIG. 4 shows a flow diagram of a manufacturing method S100 for a two-dimensional semiconductor according to the 2nd embodiment of the present disclosure. In the description to follow, the manufacturing method S100 will be described with reference to the two-dimensional semiconductor 100 of the 1st embodiment, but the present disclosure is not limited thereto. As shown in FIGS. 1, 2 and 4, in the manufacturing method S100, the two-dimensional semiconductor 100 contacts the two metals M, and the manufacturing method S100 includes a first semiconductor layer providing step S110 and a second semiconductor layer disposing step S120. The first semiconductor layer providing step S110 is performed to provide the first semiconductor layer 110 which includes the two metal contacting regions 112. The second semiconductor layer disposing step S120 is performed to provide the second semiconductor layers 120, arrange a part of the second semiconductor layers 120 on one of the two metal contacting regions 112 of the first semiconductor layer 110 in intervals to form the first heterojunctions 131 with type-II band alignment, and arrange another part of the second semiconductor layers 120 on the other one of the two metal contacting regions 112 of the first semiconductor layer 110 in intervals to form the second heterojunctions 132 with type-II band alignment, wherein an exposed top surface of each of the two metal contacting regions 112 and a top surface of each of the second semiconductor layers 120 are configured for contacting one of the two metals M.

The two-dimensional semiconductor 100 manufactured by the manufacturing method S100 can be disposed directly on a silicon substrate board which can be applied to any conventional semiconductor element, so the manufacturing method S100 is compatible with the silicon manufacturing process for conventional semiconductor elements. Moreover, the metallized semiconductor structure formed by the heterojunctions of the two metal contacting regions 112 of the first semiconductor layer 110 and the second semiconductor layers 120 can decrease the contact resistance greatly. Hence, the two-dimensional semiconductor 100 with low contact resistance can be provided and difficulties in the manufacturing process can be reduced.

As shown in FIG. 4, the first semiconductor layer providing step S110 can include a photoresist covering substep S111, a lithography substep S112 and a photoresist removing substep S113. In the description to follow, the first semiconductor layer providing step S110 will be described with the reference to the two-dimensional semiconductor 200 in FIGS. 6A to 6C, but the present disclosure is not limited thereto. The photoresist covering substep S111 is performed to cover a photoresist layer 240 on the first semiconductor layer 210, and to remove the photoresist layer 240 on each of the two metal contacting regions 212 partially to form a plurality of exposed regions 2121 at each of the two metal contacting regions 212. The lithography substep S112 is performed to remove the exposed regions 2121 of each of the two metal contacting regions 212 by etching to form a plurality of gaps 2122, and the gaps 2122 of each of the two metal contacting regions 212 are arranged and spaced away from each other. The photoresist removing substep S113 is performed to remove the photoresist layer 240. Moreover, in the 2nd embodiment, in the second semiconductor layer disposing step S120, each of the second semiconductor layers 220 can be filled in each of the gaps 2122 by chemical vapor deposition.

In the 2nd embodiment, in the second semiconductor layer disposing step S120, a temperature during chemical vapor deposition is 250° C.-800° C., but the present disclosure is not limited thereto. Compared with the conventional manufacturing method for a two-dimensional semiconductor, the manufacturing method S100 can be operated in a manufacturing process of the two-dimensional semiconductor 200 under a condition with a relatively low temperature so as to avoid destroying the usability of the silicon substrate board, and then the reliability of the manufacturing process of monolithic 3D IC to which the manufacturing method S100 is applied can be improved.

Figure 5:
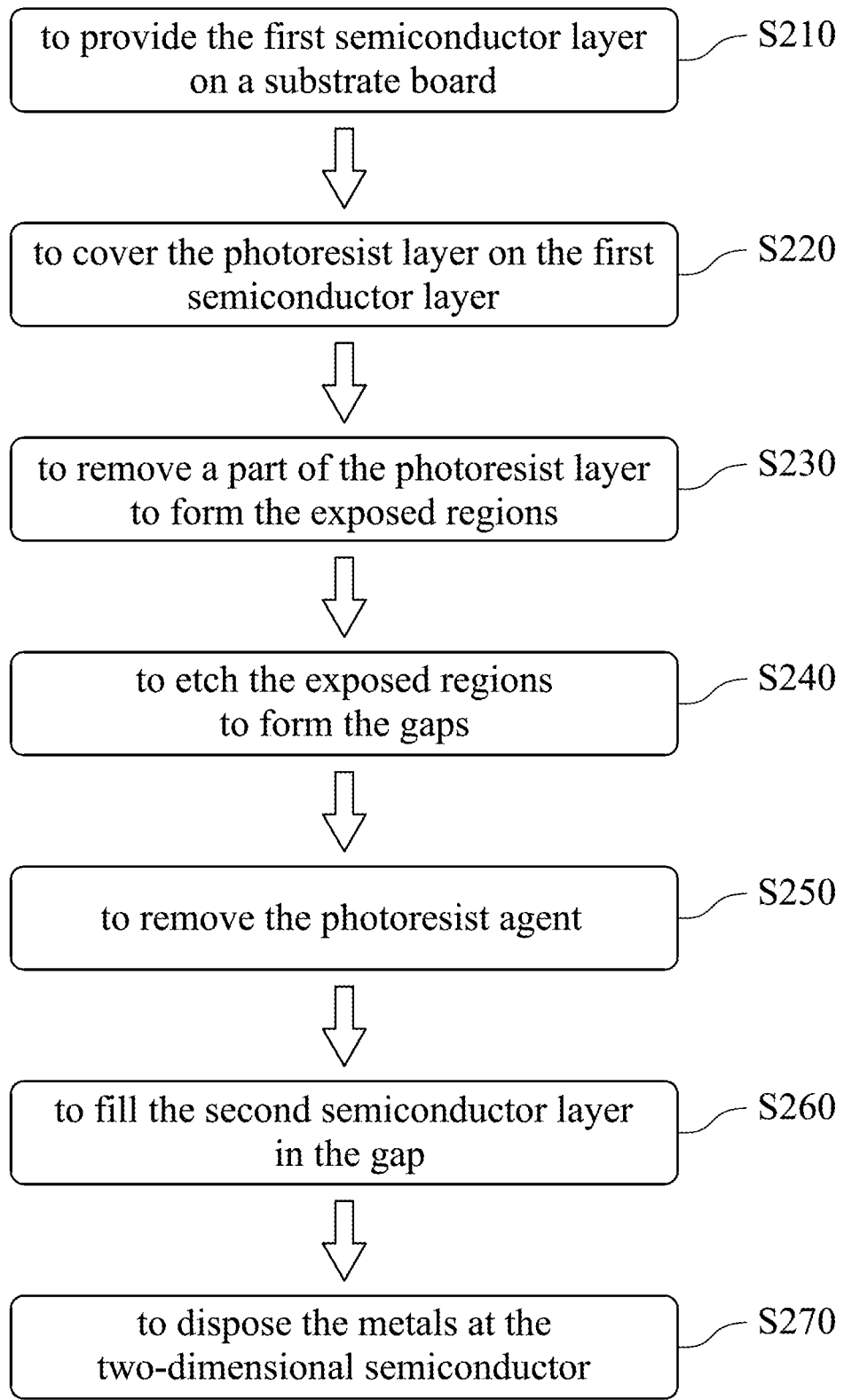
FIG. 5 shows a flow diagram of the manufacturing method according to the 2nd embodiment in FIG. 4.
Figure 6A:
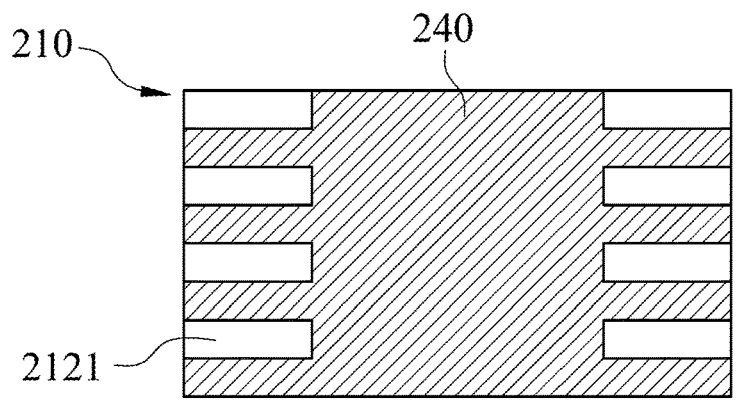
FIG. 6A shows a schematic view of a photoresist layer covering a first semiconductor layer in the manufacturing method according to the 2nd embodiment in FIG. 4.
Figure 6B:
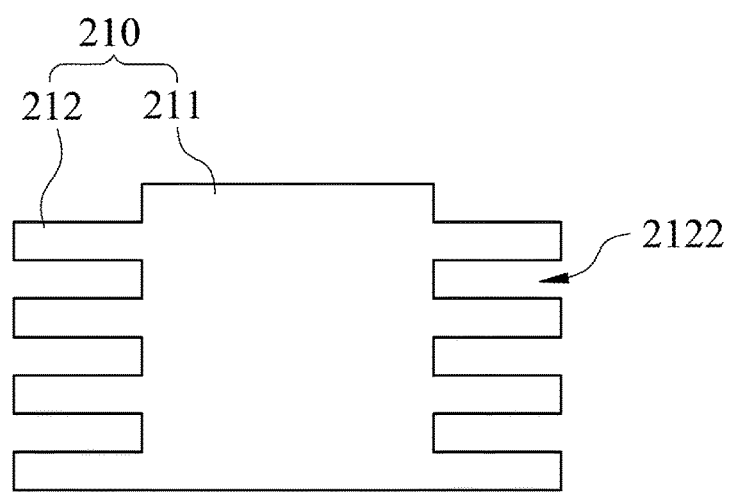
FIG. 6B shows a schematic view of etching exposed regions of each of two metal contacting regions in the manufacturing method according to the 2nd embodiment in FIG. 4.
Figure 6C:
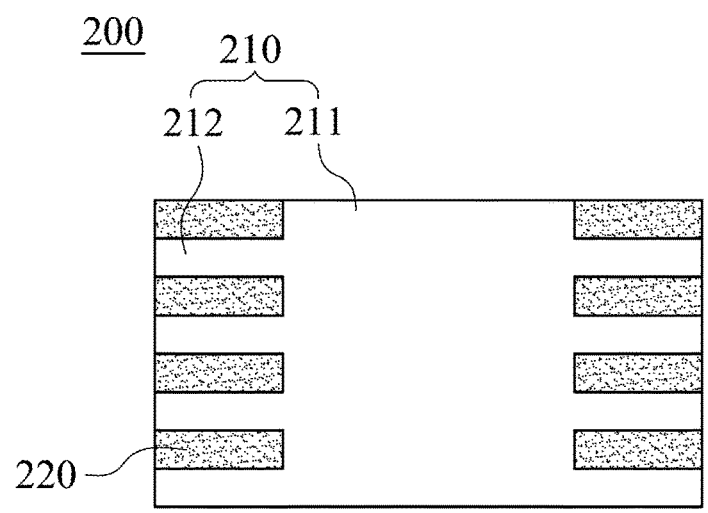
FIG. 6C shows a schematic view of a two-dimensional semiconductor manufactured by the manufacturing method according to the 2nd embodiment in FIG. 4.

FIG. 5 shows a flow diagram of the manufacturing method S100 according to the 2nd embodiment in FIG. 4. FIG. 6A shows a schematic view of the photoresist layer 240 covering the first semiconductor layer 210 in the manufacturing method S100 according to the 2nd embodiment in FIG. 4. FIG. 6B shows a schematic view of etching the exposed regions 2121 of each of the two metal contacting regions 212 in the manufacturing method S100 according to the 2nd embodiment in FIG. 4. FIG. 6C shows a schematic view of the two-dimensional semiconductor 200 manufactured by the manufacturing method S100 according to the 2nd embodiment in FIG. 4. As shown in FIGS. 5, 6A, 6B and 6C, the manufacturing method S100 includes steps S210, S220, S230, S240, S250, S260, and S270. The step S210 is performed to provide the first semiconductor layer 210 on a substrate board which is made of silicon, after which the step S220 is performed. The step S220 is performed to coat a photoresist agent on the first semiconductor layer 210 to form the photoresist layer 240, and cover the photoresist layer 240 on a surface of the first semiconductor layer 210, after which the step S230 is performed. The step S230 is performed to develop a part of the photoresist agent covering the two metal contacting regions 212 by lithography, and remove the aforementioned part of the photoresist layer 240 to form the exposed regions 2121 which are arranged in columns, after which the step S240 is performed. The step S240 is performed to etch the exposed regions 2121 to form the gaps 2122 at two sides of the channel region 211, after which the step S250 is performed. The step S250 is performed to remove all of the photoresist agent coated on the first semiconductor layer 210, after which the step S260 is performed. The step S260 is performed to fill each of the second semiconductor layers 220 in each of the gaps 2122 by chemical vapor deposition to form the two-dimensional semiconductor 200, after which the step S270 is performed. The step S270 is performed to dispose the two metals at two sides of the two-dimensional semiconductor 200, respectively, and each of the two metals contacts a top surface of the periodic semiconductor hetero structure formed by alternately arranging each of the two metal contacting regions 212 of the first semiconductor layer 210 and each of the second semiconductor layers 220.

Figure 7:
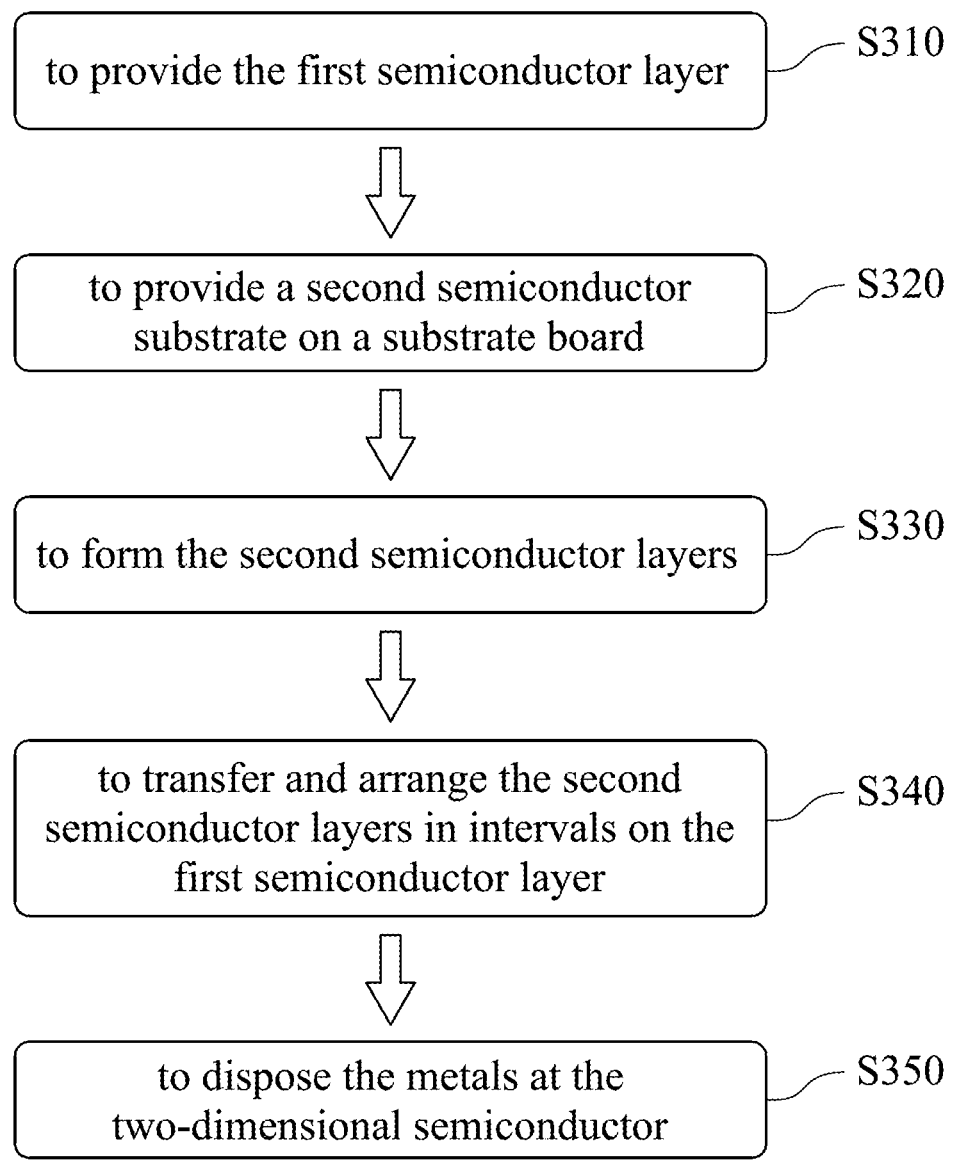
FIG. 7 shows a flow diagram of a manufacturing method for a two-dimensional semiconductor according to the 3rd embodiment of the present disclosure.
Figure 8A:
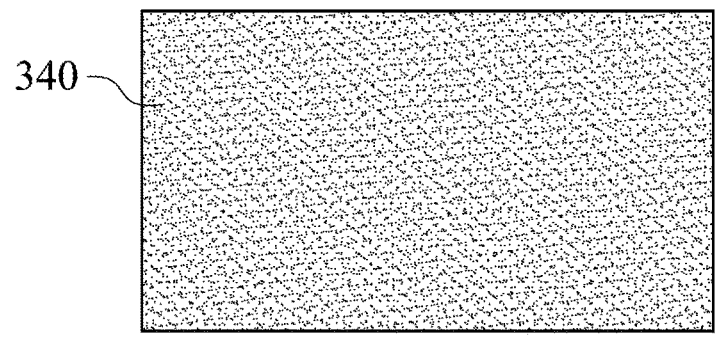
FIG. 8A shows a schematic view of a second semiconductor substrate in the manufacturing method according to the 3rd embodiment in FIG. 7.
Figure 8B:
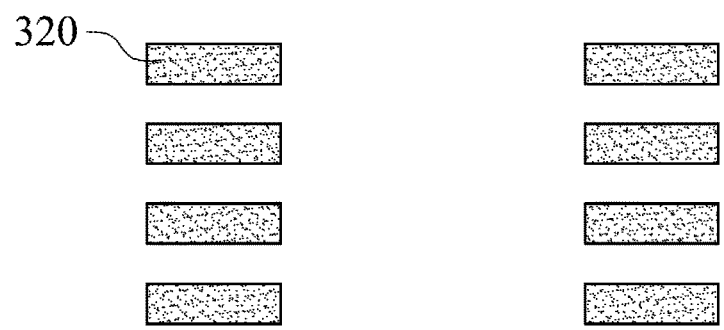
FIG. 8B shows a schematic view of second semiconductor layers in the manufacturing method according to the 3rd embodiment in FIG. 7.
Figure 8C:
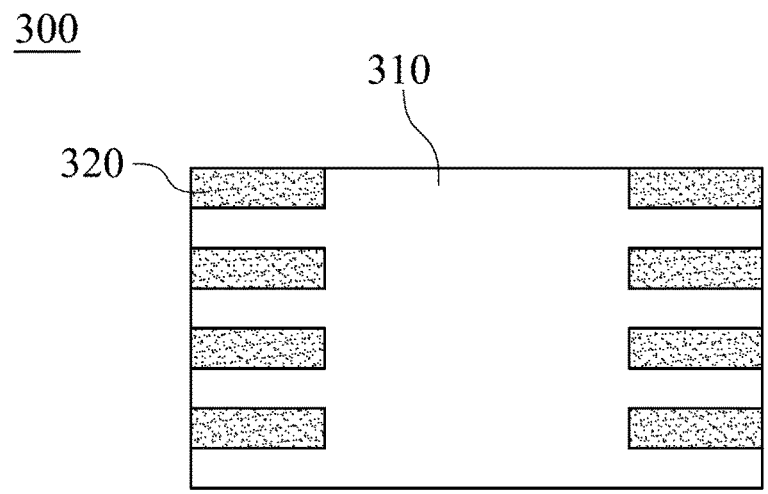
FIG. 8C shows a schematic view of the two-dimensional semiconductor manufactured by the manufacturing method according to the 3rd embodiment in FIG. 7.

FIG. 7 shows a flow diagram of a manufacturing method S300 for a two-dimensional semiconductor according to the 3rd embodiment of the present disclosure. FIG. 8A shows a schematic view of the second semiconductor substrate 340 in the manufacturing method S300 according to the 3rd embodiment in FIG. 7. FIG. 8B shows a schematic view of the second semiconductor layers 320 in the manufacturing method S300 according to the 3rd embodiment in FIG. 7. FIG. 8C shows a schematic view of the two-dimensional semiconductor 300 manufactured by the manufacturing method S300 according to the 3rd embodiment in FIG. 7. In the 3rd embodiment, the manufacturing method S300 is also performed to provide the first semiconductor layer 310, but it is worthy to note that in the second semiconductor layer disposing step of the 3rd embodiment, the second semiconductor layers 320 can be formed on a substrate board, some of the second semiconductor layers 320 are arranged in intervals on a surface of one of the two metal contacting regions of the first semiconductor layer 310 by transferring, and the rest of the second semiconductor layers 320 are arranged in intervals on a surface of the other one of the two metal contacting regions of the first semiconductor layer 310 by transferring. Moreover, in the 3rd embodiment, in the first semiconductor layer providing step, the first semiconductor layer 310 is provided at a temperature of 10° C.-100° C.; in the second semiconductor layer disposing step, the second semiconductor layers 320 are provided at a temperature of 10° C.-100° C. In greater detail, the two-dimensional semiconductor 300 can be manufactured by the manufacturing method S300 at room temperature during the whole process.

Hence, compared with the conventional manufacturing method for a two-dimensional semiconductor, the manufacturing method S300 can be operated in a manufacturing process of the two-dimensional semiconductor 300 at room temperature so as to avoid destroying the usability of the silicon substrate board, and then the reliability of the manufacturing process of monolithic 3D IC to which the manufacturing method S300 is applied can be improved.

Specifically, in the 3rd embodiment, the manufacturing method S300 includes steps S310, S320, S330, S340, and S350. The step S310 is performed to provide the first semiconductor layer 310, after which the step S320 is performed. The step S320 is performed to provide a second semiconductor substrate 340 on a substrate board which is made of silicon, after which the step S330 is performed. It is worthy to note that the steps S310 and S320 can be performed at the same time, or the step S320 can be operated first before performing the step S310, and the present disclosure is not limited to the aforementioned order. The step S330 is performed to remove the second semiconductor substrate 340 partially to form the second semiconductor layers 320 on the aforementioned substrate board, after which the step S340 is performed. The step S340 is performed to put each of the second semiconductor layers 320 on a surface of each of the two metal contacting regions of the first semiconductor layer 310 by transferring, to arrange some of the second semiconductor layers 320 in intervals on the surface of one of the two metal contacting regions of the first semiconductor layer 310, and to arrange the rest of the second semiconductor layers 320 in intervals on the surface of the other one of the two metal contacting regions of the first semiconductor layer 310 to form the two-dimensional semiconductor 300, after which the step S350 is performed. The step S350 is performed to dispose the two metals at two sides of the two-dimensional semiconductor 300, respectively, and each of the two metals contacts a top surface of the periodic semiconductor hetero structure formed by alternately arranging each of the two metal contacting regions of the first semiconductor layer 310 and each of the second semiconductor layers 320.

In summary, the present disclosure has the following advantages: first, by the heterojunctions with type-II band alignment, the metal contacting regions of the first semiconductor layer and the second semiconductor layers can be metallized so as to decrease contact resistance; second, by disposing each of the second semiconductor layers in each of the gaps of the metal contacting regions with the comb structure, the area of the heterojunctions can be increased to further decrease Schottky barrier; and, third, by transferring the second semiconductor layers on the surface of the first semiconductor layer, manufacturing can be performed at room temperature to improve reliability of the manufacturing process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A two-dimensional semiconductor, configured for contacting two metals, comprising:
    a first semiconductor layer, comprising:
        a channel region; and
        two metal contacting regions connected to two sides of the channel region, respectively; and
    a plurality of second semiconductor layers, wherein a plurality of heterojunctions having type-II band alignment are formed by the plurality of second semiconductor layers and the two metal contacting regions of the first semiconductor layer, respectively, and the plurality of heterojunctions are arranged and spaced away from each other.

2. The two-dimensional semiconductor of claim 1, wherein the first semiconductor layer is composed of a single-layered semiconductor.

3. The two-dimensional semiconductor of claim 1, wherein the first semiconductor layer is composed of a plurality of single-layered semiconductors stacked on top of each other.

4. The two-dimensional semiconductor of claim 1, wherein each of the plurality of second semiconductor layers is composed of a single-layered semiconductor.

5. The two-dimensional semiconductor of claim 1, wherein each of the plurality of second semiconductor layers is composed of a plurality of single-layered semiconductors stacked on top of each other.

6. The two-dimensional semiconductor of claim 1, wherein the two metal contacting regions of the first semiconductor layer which contact bottoms of the two metals are bonded to the plurality of second semiconductor layers in a seamless structure to form two hetero structures, respectively.

7. The two-dimensional semiconductor of claim 1, wherein the plurality of second semiconductor layers are stacked on the two metal contacting regions of the first semiconductor layer which contact bottoms of the two metals to form two hetero structures, respectively.

8. The two-dimensional semiconductor of claim 1, wherein a plurality of charge carriers of the first semiconductor layer which contacts bottoms of the two metals and a plurality of charge carriers of the plurality of second semiconductor layers cross the plurality of heterojunctions, and each of the first semiconductor layer and the plurality of second semiconductor layers is doped.

9. The two-dimensional semiconductor of claim 1, wherein a charge carrier concentration of each of the first semiconductor layer which contacts bottoms of the two metals and the plurality of second semiconductor layers increases to metallize the first semiconductor layer and the plurality of second semiconductor layers.

10. The two-dimensional semiconductor of claim 1, wherein each of the two metal contacting regions is a comb structure and has a plurality of gaps, the plurality of gaps are arranged and spaced away from each other, and each of the plurality of second semiconductor layers is disposed in each of the plurality of gaps.

11. The two-dimensional semiconductor of claim 1, wherein a spaced distance between each of the plurality of heterojunctions is different from each other.

\* \* \* \* \*